United States Patent
Uzoh et al.

(10) Patent No.: US 6,692,588 B1
(45) Date of Patent: Feb. 17, 2004

(54) METHOD AND APPARATUS FOR SIMULTANEOUSLY CLEANING AND ANNEALING A WORKPIECE

(75) Inventors: Cyprian Emeka Uzoh, Milpitas, CA (US); Homayoun Talieh, San Jose, CA (US)

(73) Assignee: Nutool, Inc., Milpitas, CA (US)

( * ) Notice: Subject to any disclaimer, the term of this patent is extended or adjusted under 35 U.S.C. 154(b) by 412 days.

(21) Appl. No.: 09/351,868

(22) Filed: Jul. 12, 1999

(51) Int. Cl.[7] ................................................. B08B 3/10
(52) U.S. Cl. ...................... 148/516; 148/536; 148/687; 148/713; 134/1.3; 438/906
(58) Field of Search ................................. 148/516, 525, 148/536, 687, 713; 438/906; 134/1.3

(56) References Cited

U.S. PATENT DOCUMENTS

| | | | | |
|---|---|---|---|---|
| 3,865,642 A | * | 2/1975 | Foreman | 148/713 |
| 3,928,443 A | * | 12/1975 | Allain et al. | 502/313 |
| 4,306,857 A | | 12/1981 | Hofstetter et al. | 432/121 |
| 4,902,342 A | * | 2/1990 | Wahlbeck | 75/631 |
| 5,653,045 A | * | 8/1997 | Ferrell | 34/341 |
| 5,681,407 A | * | 10/1997 | Yu et al. | 148/713 |
| 5,707,466 A | * | 1/1998 | Atwater et al. | 148/525 |
| 5,800,626 A | * | 9/1998 | Cohen et al. | 134/1.3 |
| 5,811,334 A | * | 9/1998 | Buller et al. | 438/906 |

OTHER PUBLICATIONS

PCT/US00/40354, filed Jul. 11, 2000, PCT Written Opinion, Mailed Oct. 25, 2001.

* cited by examiner

*Primary Examiner*—George Wyszomierski
(74) *Attorney, Agent, or Firm*—Pillsbury Winthrop LLP

(57) ABSTRACT

The present invention is directed to a method and apparatus for simultaneously cleaning and annealing a plated semiconductor workpiece. A chamber for simultaneously cleaning and annealing a semiconductor workpiece is provided herein. The method according to the present invention includes the steps rinsing the workpiece with mineral acids and DI water, then simultaneously cleaning/annealing the workpiece with heated deoxygenated DI water. By this present method, tool cross contamination by way of plated metal is greatly reduced, and also grain recovery and grain growth at room temperature is greatly accelerated. Thus, the annealing time of grain growth is dramatically reduced using the present method and apparatus.

73 Claims, 4 Drawing Sheets

METHOD AND APPARATUS FOR SIMULTANEOUSLY CLEANING AND ANNEALING A WORKPIECE

FIELD OF THE INVENTION

The present invention relates to a method and apparatus for simultaneously cleaning and annealing a conductive film deposited on a substrate. More particularly, the present invention is directed to a method and apparatus for effectively rinsing contaminants from the front and back surfaces of a workpiece while annealing the same. This is accomplished by using high temperature de-ionized oxygen free water or other suitable liquids for cleaning and annealing. By this present method, tool cross contamination by way of plated metal is greatly reduced, and also grain recovery and grain growth at room temperature is greatly accelerated. Thus, the annealing time of grain growth is dramatically reduced using the present method and apparatus.

BACKGROUND OF THE INVENTION

The semiconductor industry continues to be a multi-billion dollar industry as millions of semiconductor chips, devices, and integrated circuits are produced in fabrication centers throughout the world. As the demand for semiconductor chips increases so does the demand for faster, less expensive, and more reliable chips.

There are many fabrication steps in the manufacturing of semiconductor chips. The present invention focuses on a certain phase of this manufacturing process. For example, FIG. 1 illustrates a flow chart of a phase in a conventional fabrication process. Although only a limited number of process steps are illustrated in FIG. 1, other processing steps as known in the art are used during the entire fabrication process. For instance, in the electro-deposition of copper for chip interconnect or packaging applications, after metal deposition from a suitable electroplating bath, the workpiece is rinsed thoroughly with suitable liquids to reduce the amount of metal that may be present on the workpiece backside. Further, for optimal performance, it is preferable to anneal the workpiece at room temperature, oven or furnace before the chemical mechanical polishing (CMP) step.

As an example, in copper chip and packaging applications, after the plating step 2, a cleaning/rinsing step 4 is typically performed to remove spurious contaminants from the substrate or workpiece backside. Contaminants typically fall into several categories: particulate; and organic and inorganic residues such as copper sulfates or other potential contaminants that may originate from the plating bath. Having a clean workpiece backside is essential in preventing copper contamination of subsequent tools.

The cleaning/rinsing step 4 is generally performed using a liquid chemical such as about 2 to 20% mineral acid solutions containing, for example, 5% sulfuric acid. After the workpiece backside cleaning, the mineral acid is rinsed off the workpiece using strayed de-ionized (DI) water, thus completing the cleaning/rinsing step 4.

Typically, after metal plating step 2 and cleaning/rinsing step 4, the substrate is then planerized during a CMP step 8. However, for optimal device or interconnect performance, it is desirable to anneal the workpiece to stabilize the structure of the electro-deposit in an annealing step 6. Conventionally, the workpiece can be annealed in room temperature for 2–3 days, or can be annealed in a tube furnace or conventional oven for 3 minutes to 3 hours at a temperature that ranges from 50° to 450° C. in an inert ambient like nitrogen or vacuum.

As can be appreciated, the time and effort needed during this phase of the fabrication process can be improved and simplified. Accordingly, a more efficient and time saving method and apparatus for insitu cleaning and annealing of a plated workpiece is disclosed herein.

SUMMARY OF THE INVENTION

It is an object of the present invention to provide a method and apparatus for insitu simultaneously cleaning/annealing of a plated substrate.

It is another object of the present invention to provide a method and apparatus for simultaneously cleaning/annealing a plated semiconductor device or package.

It is a further object of the present invention to provide a method and apparatus for simultaneously cleaning/annealing a semiconductor device or package with minimal time.

These and other objects of the present invention are obtained by providing a chamber for simultaneously cleaning and annealing semiconductor workpieces. The method according to the present invention includes the steps of initially rinsing (spraying) the workpiece with preferably, mineral acids such as 5–20% sulfuric acid, followed by a brief DI water rinse, then replacing the DI water with heated deoxygenated DI water in order to simultaneously clean/anneal the workpiece. Alternatively, the workpiece can be initially rinsed with DI water and then rinsed with mineral acids. Thereafter, heated deoxygenated DI water is used to simultaneously clean/anneal the workpiece.

BRIEF DESCRIPTION OF THE DRAWINGS

These and other objects and advantages of the present invention will become apparent and more readily appreciated from the following detailed description of the presently preferred exemplary embodiment of the invention taken in conjunction with the accompanying drawings, of which.

DETAILED DESCRIPTION OF THE PREFERRED EMBODIMENTS

Figure 1:
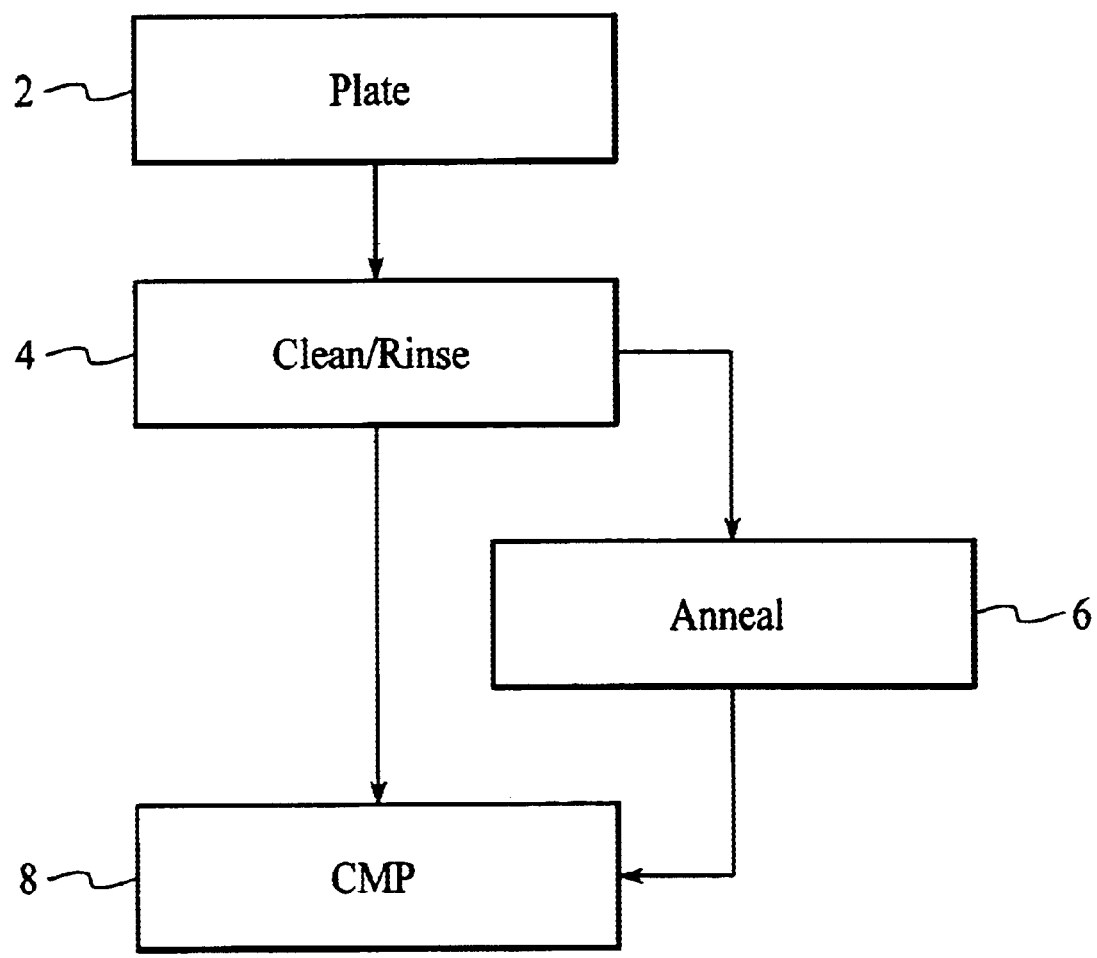
FIG. 1 illustrates a flow chart of a limited number of steps in a conventional fabrication process.

The preferred embodiments of the present invention will now be described with reference to FIGS. 2–4, wherein like components are designated by like reference numerals throughout the various figures.

Figure 2:
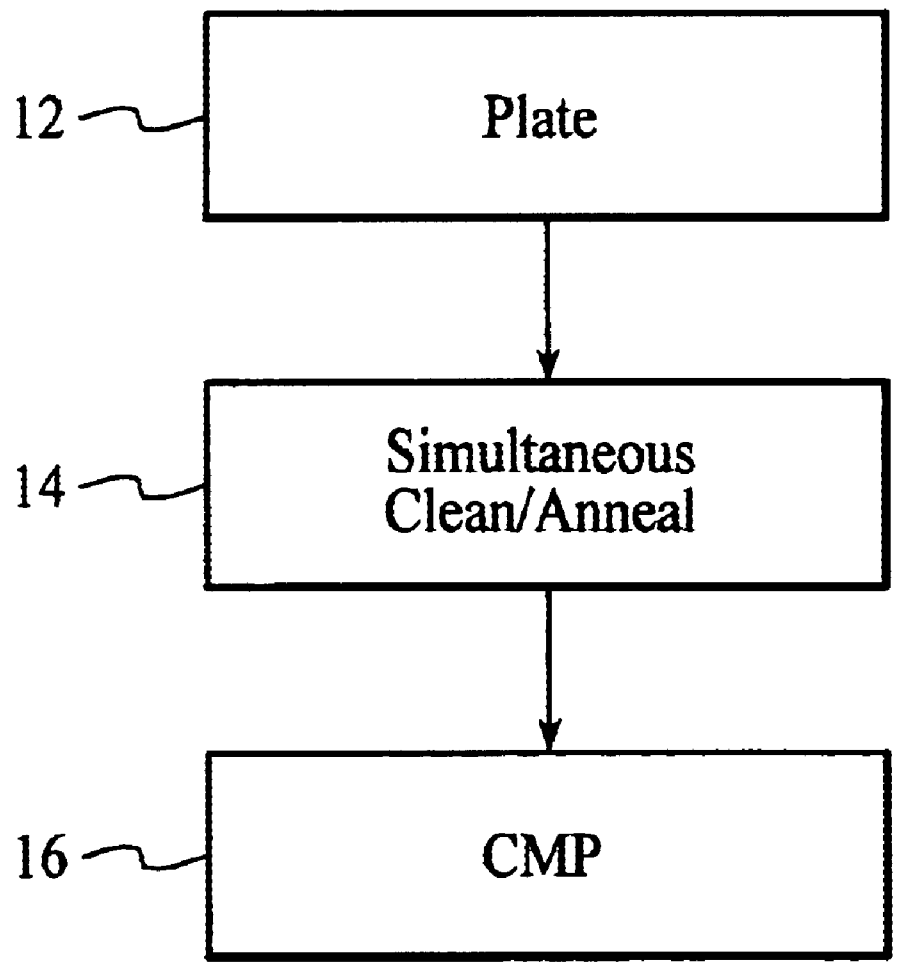
FIG. 2 illustrates a flow chart of a limited number of steps in accordance with the preferred embodiment of the present invention.

FIG. 2 illustrates a flow chart of a limited number of processing steps in accordance with the preferred embodiment of the present invention. As illustrated, the flow chart includes a plating step 12, a cleaning/annealing step 14, and a CMP step 16. Unlike the conventional plating step 2, cleaning/rinsing step 4, annealing step 6, and CMP step 8 described in the background section of this disclosure, the present invention includes a combined simultaneous cleaning/annealing step 14, which is described in more detail later herein. Thus, with the present invention, a method and apparatus for saving time and equipment costs are disclosed.

The present invention can be used with any conductive material such as copper, iron, chromium, indium, lead, lead-tin alloys, silver, tin and tin alloys, zinc, cadmium, titanium, cadmium-titanium alloys, molybdenum, ruthenium, gold, nickel, palladium, cobalt, rhodium, platinum, and various combinations thereof, and for use in the fabrication of integrated circuits, magnetic films such as permalloy, and metal seed layers having LSI to beyond ULSI integrated circuit features and dimensions. Furthermore, although a semiconductor wafer will be used to describe the preferred embodiments of the present invention, other semiconductor workpieces such as a flat panel, magnetic film head, or packaging substrate including lead-tin solder alloys, or lead free solderable alloys, may be processed using the present invention. Further, specific processing parameters such as time, temperature, pressure and the like are provided herein, which specific parameters are intended to be explanatory rather than limiting.

Consider the electro-deposition of copper from a suitable copper plating baths on a wafer. Typically, after the metal deposition, the substrate is rinsed or cleaned with copious amount of DI water and perhaps with dilute mineral acids to remove spurious copper on the wafer backside, prior to metal polish by CMP. For optimum interconnect performance, it is highly desirable to stabilize the structure of the electroplated metal by annealing the plated copper. Annealing may be allowed to occur at room temperature for over a period of three days or longer. On the other hand, annealing the plated wafer at higher temperatures may accelerate the grain structure stabilization. Thus, the plated wafer may be transported to a suitable oven or tube furnace for faster annealing. The annealing temperature may range from 60° to 450° C. in an inert ambient such as nitrogen or in a reducing ambient, or even in a vacuum chamber.

Figure 3:
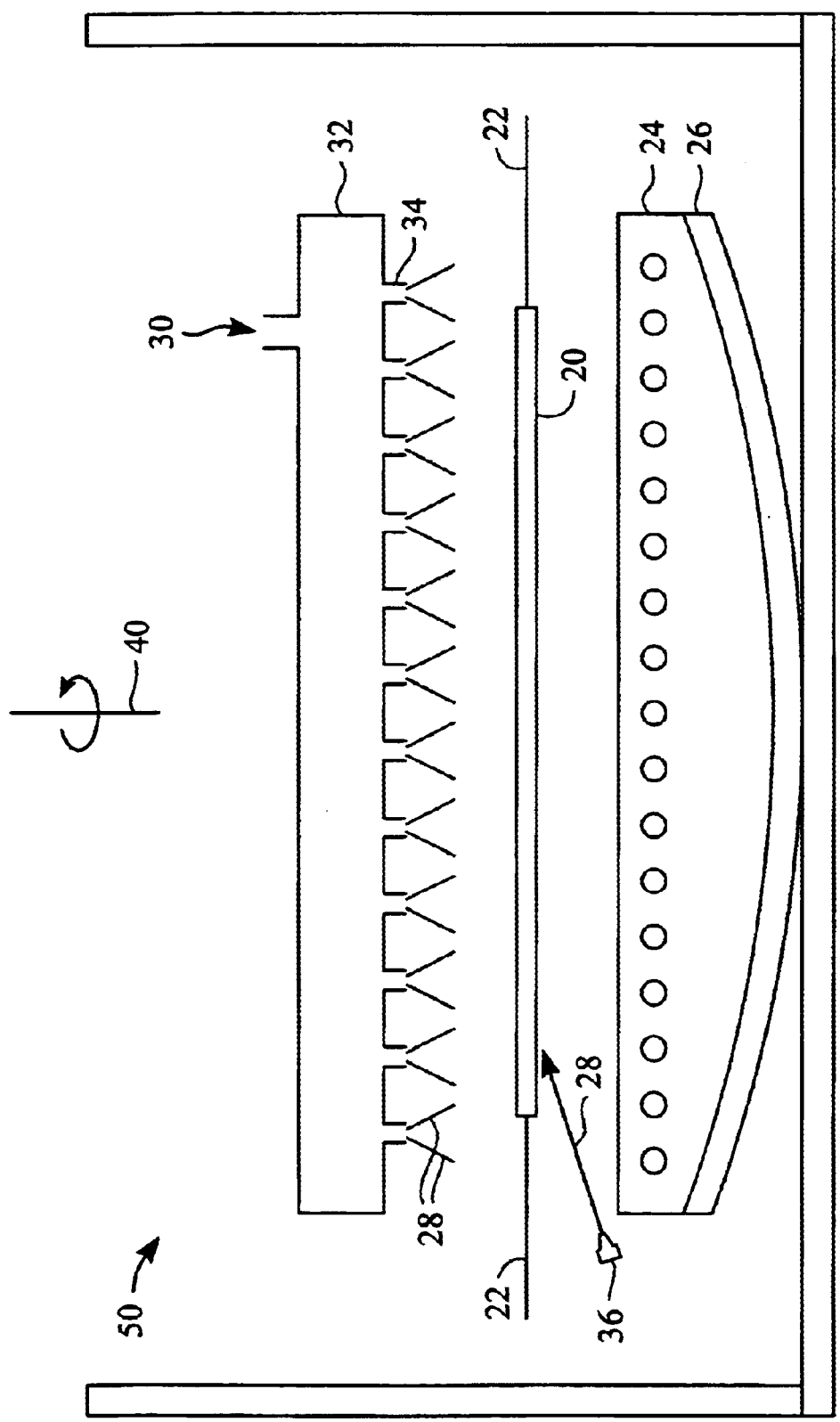
FIG. 3 illustrates a cross sectional view of a preferred embodiment of the present invention.

FIG. 3 illustrates a cross sectional view of a preferred embodiment of the present invention. In the present invention, the inventors disclose a method for simultaneously cleaning and annealing the plated copper film in an ambient of deoxygenated DI water. For example, after copper deposition from a suitable bath, be it by electroplating or electroless plating, the plated wafer 20 is transported to a cleaning/annealing chamber 50. In the chamber 50, the wafer 20 is supported about its edge and rotates about its major axis 40 with the aid of a support 22. Initially, DI water may be introduced into the chamber 50 via an inlet 30 and a spray type nozzle 36, and sprayed onto the rotating wafer 20 via a shower head 32 and a spray direction 28. The wafer 20 is rinsed with DI water that flows via apertures 34 to the rotating wafer 20 to create a shower type condition.

The backside of the wafer 20 is shown facing the shower head 32. In other embodiments, the plated face of the wafer 20 may face the shower head 32. In either case, a second source of DI water from the nozzle type spray 36 is sprayed on the side of the wafer 20 facing a heating lamp/source 24. Reflectors 26 are positioned on the bottom of the heating lamp/source 24. During this process, the wafer rotates between 5 to 100 RPM for a period ranging from 5 to 10 seconds or longer.

After the brief DI water rinse as described above, a dilute mineral acid solution such as 1 to 15% sulfuric acid from a closed loop recirculating bath (no shown) is introduced via the inlet 30 and nozzle type stray 36 to rinse the wafer 20 for the second time. The wafer may rotate between 5 to 100 RPM for a period of 5 to 15 seconds during this acid rinse process. The remaining solution on the wafer may then be spun off at a higher spin speed, typically between 1000 to 2000 RPM.

After the acid rinse, heated de-oxygenated DI water from a closed loop recirculating arrangement is fed through again via inlet 30 and spray nozzle 36. The wafer 20 rotation rate is then reduced to 2–20 RPM, but preferably to 5 RPM. Meanwhile, the heating lamp 24 is energized to heat the wafer 20 along with the applied deoxygenated DI water. The heated de-oxygenated DI water, which may be heated prior to being applied and also from the heating lamp 24, and the heat from the heating lamp 24 can now be used to simultaneously clean/anneal the wafer. The temperature at which DI water evaporates is 100° C. Thus, the de-oxygenated DI water can be heated between 60–99° C.

The temperature of the wafer may range between 60 to 450° C., and the annealing time may range between 5 seconds to 20 minutes, although longer annealing times can be used if desired. Moreover, the higher the wafer temperature, the shorter the required anneal time. Furthermore, the heating lamp 24 can generate infrared light because infrared light does not get absorbed by de-ionized DI water, but does get absorbed by the wafer 20 during the annealing process.

In other embodiments, the wafer can be initially rinsed with mineral acid solution and then rinsed with DI water that is not heated or subjected to heat. Thereafter, deoxygenated DI water that is heated and/or subject to heat is used to simultaneously rinse/anneal the wafer.

Figure 4:
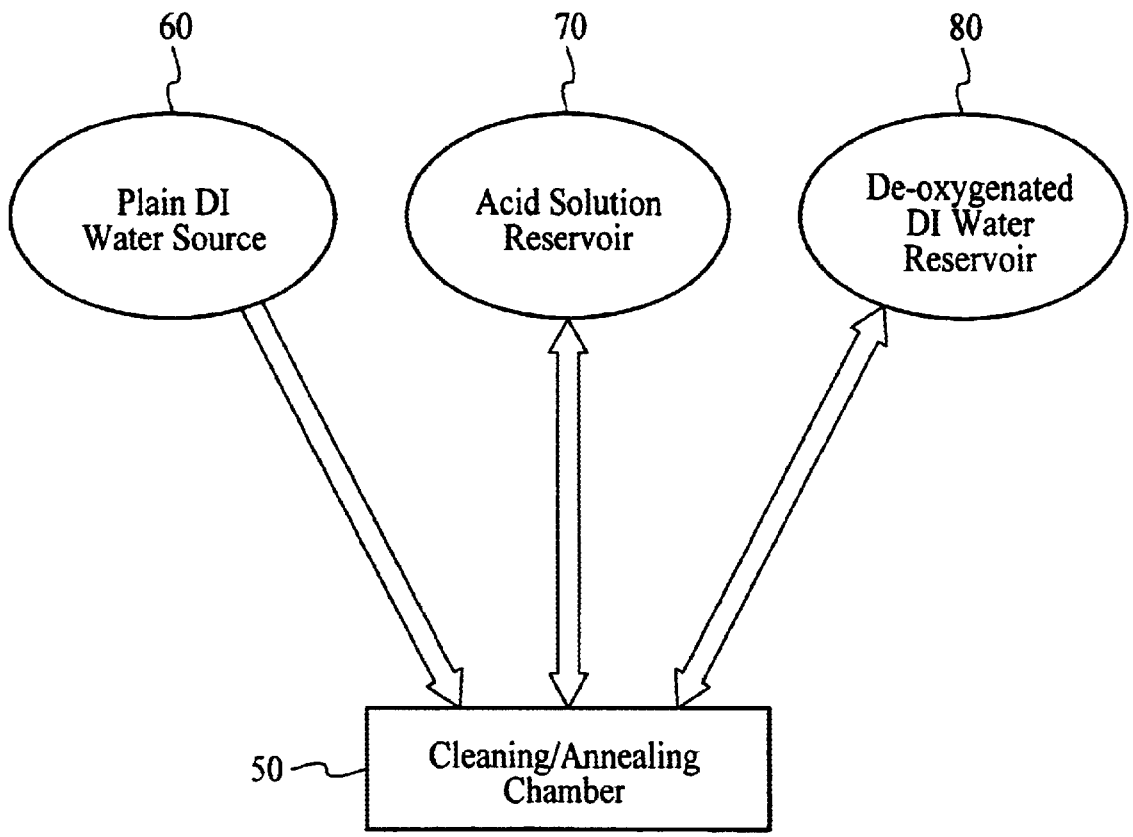
FIG. 4 illustrates a simplified block diagram of one embodiment of an overall. system of the present invention.

FIG. 4 illustrates a simplified block diagram of one embodiment of an overall system of the present invention. This figure illustrates the cleaning/annealing chamber 50 that is adapted to receive DI water from a DI water source 60, acid solution from an acid solution reservoir 70, and de-oxygenated DI water from a de-oxygenated DI water reservoir 80. In addition, acid solution and de-oxygenated DI water are adapted to flow back out of the cleaning/annealing chamber 50 into their respective reservoirs. Any conventional components (pipes, funnels, lines, etc.) and methods for flowing these liquids into and out of the cleaning/annealing chamber 50 may be used in the present invention.

Nitrogen or other suitable inert gases may be bubbled in the deoxygenated water, continuously or intermittently, to displace all or any spurious oxygen in the water. In addition, 0.5 to 50 g of a pentose sugar, or other variations/additives/ combinations of pentose sugars, may be added to the water to further enhance the deoxygenation process. Alternatively, hydrogen or forming gas may be bubbled into the water to impart some reducing ambient during the insitu cleaning and annealing.

Whatever type of the cleaning fluid used, the lamp induced temperature of the workpiece may be rapidly increased from around room temperature to about 450° C., for example in less than 10 seconds. The wafer anneal temperature may range from 60° to 450° C., while the anneal time may range between 5 seconds to 20 minutes, although longer annealing times can be used if desired. When the heating lamp 24 is shut off or de-energized, the annealing fluid may be allowed to continue to circulate in the chamber for an additional period, typically 5 to 20 seconds or longer before the fluid is flowed out of the chamber 50.

The wafer is then spun at a very high rotation rate for spin drying. The wafer is then unloaded from the chamber 50. Thereafter, the grain recovery and grain growth may be allowed to continue at a room temperature before metal CMP.

In accordance with the present invention, other annealing fluids such as propylene glycol and their various analogues may be used. One of the essential properties of the annealing fluid is that it does not oxidize the metal or material being annealed. Thus, it may be imperative that the fluid be deoxygenated either by bubbling an inert gas such as nitrogen, argon, or other additives that retard oxygen incorporation into the annealing fluid. The annealing fluid used in the present invention could also be a compressed heated inert gas.

In other embodiments of this invention, multiple wafers (e.g., up to 200) can be loaded into holders and annealed simultaneously. In this scenario, multiple heating lamps are used to heat the annealing fluid in the cleaning/annealing chamber while the chamber is pressurized as during the annealing process. Alternatively, infrared heating elements, inline high power heating elements, or microwave radiation, or other desirable methods can be used to heat the annealing fluid and the wafers. The annealing liquid is preferably de-oxygenated DI water or other fluids that will not oxidize the material being annealed. Further, when the chamber is pressured, the annealing fluid does not need to be circulated. However, the workpiece/wafer preferably rotates in order to optimize heat transfer within the apparatus. Other methods of heating the fluid and wafers can be used. When simultaneously annealing multiple wafers, the annealing time ranges from 10 seconds to 45 minutes, depending on the choice of annealing temperature and the amount of energy transferred from the heating source to the annealing fluid/wafer, although longer annealing times can be used if desired. The anneal time is longer for processing multiple workpieces as opposed to process a single workpiece because of a larger mass among the multiple workpieces.

To heat the annealing fluid that is held in the reservoir, cleaning/annealing chamber, or in fluid lines, a high voltage power supply may be used. Any conventional method of heating the annealing fluid in the reservoir, cleaning/annealing chamber, or in the fluid lines may be used in the present invention. The annealing fluid temperature can be controlled by a series of thermocouples in the reservoir, chamber, and return drain lines. For instance, when there is a temperature difference between the annealing fluid in the reservoir and in the chamber, the thermocouples can determine the amount of heat or power that need to be provided to the heaters in either the reservoir or chamber such that the temperature of the annealing fluid is optimal. The highest temperature to which the annealing fluid can be heated without evaporation is dependent on the fluid being used. For example, DI water will evaporate at 100° C. while propylene glycol will evaporate at about 200° C. Thus, the propylene glycol can be heated to a temperature between 60–200° C.

In addition, an oxygen sensor can also be used to measure the oxygen content of the annealing fluid. Inert gas bubbling into the reservoir or fluid lines towards the chamber is regulated to keep the oxygen level of the annealing fluid preferably below 3 ppms in the anneal chamber.

Heated de-oxygenated dilute mineral acid (heated above room temperature) can also be used for simultaneous wafer rinsing, cleaning, and annealing. For example, a heated solution of about less than 0.1% sulfuric acid may be used to simultaneously clean the wafer backside and also anneal the wafer. The circulating dilute mineral acid is pumped from a close loop reservoir and chamber arrangement. Organic mineral acid like solutions containing 0.1% or less methyl sulfonic acid may be used in the present invention. Combinations or mixtures of mineral and organic acid solutions may be used in the cleaning/annealing process. Also, amino acids, hydroxides, or other suitable bases may also be used as the cleaning/annealing fluid. For example, a small amount of benzotriazole type compounds (e.g. 2 g/L) may be added to deoxygenate the fluid. A copper concentration sensor in combination with conventional electrodes closely monitors the amount of copper in the cleaning fluid. When copper concentration in the rinsing/annealing fluid exceeds some threshold, the electrodes are energized to plate by the copper ion monitor, to plate out copper metal from the cleaning fluid in the reservoir.

The present invention can also be used with other applications. For example, the substrate can be a metal seed layer or base layer deposited by electroless, sputtering, or other methods. The present process may be used to enlarge the grain size of the seed layer prior to metal deposition. The present method can also be used to reduce oxide film of some metallic structures to enhance appearance of the substrate or to prepare the substrate prior to subsequent deposition processes. For example, cleaning and annealing a sputtered copper or gold seed layer using the process of the present invention modifies the structure of the seed layer and, by so doing, modifies the microstructure of the subsequently plated film on the seed layer. The present method may also be used to modify the microstructure and properties of magnetic alloys, such as permalloy, and various magneto-resistive type films.

In addition, the present invention may be used to modify the grain size, microstructure, texture, corrosion resistance, and other metallurgical properties of the deposited metal. For example, a first metal layer may be deposited on a suitable substrate by electrochemical or non-electrochemical process for a brief period of time (e.g., 30 to 60 seconds). The first metal layer is rapidly cleaned/annealed to modify the metallurgical properties. Then, a second metal layer from the same bath or other source (e.g., chrome layer) is formed over the first metal layer. Thus, the nature and metallurgical properties of the second metal layer (i.e. grain size) which has not yet been cleaned/annealed is significantly different from the properties of the first metal layer. For example, after the cleaning/annealing process, the first deposited layer may include grains that are between 50 to 100 nm plated copper while the second deposited layer may include grains that are between 300 to 2000 nm plated copper. If, on the other hand, the first metal layer is not cleaned/annealed using the process of the present invention, then the metallurgical properties of the first and second metal layers may be the same.

Because the grain size is increased as mentioned above, the corrosion resistance is also improved. Corrosion occurs generally between boundaries of the grains. When the size of the grains is increased, there are fewer boundaries within the material and thus, the corrosion resistance is improved.

In another example, copper may be used as the first deposited layer, while permalloy or chromium may be used as the second deposited layer. In other embodiments, any combination of platable materials or materials deposited by other methods can be used in the present invention. The present invention can also be used to form multi-layers of metal to form a symmetric/non-symmetric laminate film. The laminate film may contain a different type of material or non-homogeneous material. The laminate film may be given further processing treatment such as annealing at a different temperature and ambient in order to form a different alloy film or new materials. Besides using the standard deoxygenated DI water or other cleaning/annealing fluid as discussed above, various nitrogen and non-nitrogen bearing organic compounds such amines, carbonates, amides, hydroxyamines, surfactants, and their combinations may be added to the cleaning/annealing fluid to modify the surface of the cleaned/annealed material. The addition of these additives or other suitable additives to the cleaning fluid may be used to impart desirable metallurgical properties to the cleaned/annealed surface. For example, the cleaning/annealing process may impart superior corrosion resistance to the cleaned surface. It could be used to modify the cleaned material surface such that the subsequently deposited material or materials on the cleaned surface possesses unique and beneficial material properties such as texture, grain size, magnetic and isotropic, optical, magneto-optical properties, and tribological properties.

The process according to the present invention is also used to alter the texture of the plated material. For example, the texture may change from a <111> orientation to a <110> or more random orientation after the cold working process.

In the previous descriptions, numerous specific details are set forth, such as specific materials, structures, chemicals, processes, etc., to provide a thorough understanding of the present invention. However, as one having ordinary skill in the art would recognize, the present invention can be practiced without resorting to the details specifically set forth.

Although only the above embodiments have been described in detail above, those skilled in the art will readily appreciate that many modifications of the exemplary embodiment are possible without materially departing from the novel teachings and advantages of this invention.

We claim:

1. A method for simultaneously cleaning and annealing a metallic layer plated on a workpiece having an insulating substrate, the method comprising the step of applying a cleaning and annealing fluid to the metallic layer while heating the workpiece and the applied cleaning and annealing fluid.

2. A method according to claim 1, wherein the step of heating the workpiece and the applied cleaning and annealing fluid comprises the step of energizing a heating source.

3. A method according to claim 2, wherein the heating source comprises reflectors that are adapted to reflect heat to the workpiece.

4. A method according to claim 1, wherein the step of heating the workpiece and the applied cleaning and annealing fluid comprises the step of generating microwave radiation.

5. A method according to claim 1, wherein the cleaning and annealing fluid comprises deoxygenated de-ionized water.

6. A method according to claim 5 further comprising the step of deoxygenating the de-ionized water by adding bubbled nitrogen to the de-ionized water.

7. A method according to claim 5 further comprising the step of deoxygenating the de-ionized water by adding bubbled argon to the de-ionized water.

8. A method according to claim 5 further comprising the step of deoxygenating the de-ionized water by adding bubbled inert gas to the de-ionized water.

9. A method according to claim 5 further comprising the step of deoxygenating the de-ionized water by adding a reducing gas.

10. A method according to claim 5 further comprising the step of deoxygenating the de-ionized water by adding pentose sugar to the de-ionized water.

11. A method according to claim 5, wherein the deoxygenated de-ionized water is heated to a temperature between 60–99° C.

12. A method according to claim 1 further comprising the step of rotating the workpiece about a first axis while applying the cleaning and annealing fluid.

13. A method according to claim 12, wherein the step of rotating the workpiece comprises the step of rotating the workpiece between 2–20 revolutions per minute.

14. A method according to claim 1, wherein the workpiece comprises one of a semiconductor wafer, flat panel, magnetic film head, and a packaging substrate.

15. A method according to claim 1, wherein the workpiece is heated to a temperature between 60 to 450° C.

16. A method according to claim 15, wherein the workpiece is heated for 5 seconds to 20 minutes.

17. A method according to claim 1, wherein the cleaning and annealing fluid comprises propylene glycol.

18. A method according to claim 17, wherein the propylene glycol is heated to a temperature between 60–200° C.

19. A method according to claim 1, wherein the step of heating the workpiece and the applied cleaning and annealing fluid heat the applied cleaning and annealing fluid to a temperature above the temperature at which the cleaning and annealing fluid was originally applied.

20. A method according to claim 1, wherein the cleaning and annealing fluid is heated to a temperature between 60–200° C. prior to applying the cleaning and annealing fluid to the workpiece.

21. A method according to claim 1 wherein the applied cleaning and annealing fluid changes during the time that the step of applying the cleaning and annealing fluid to the metallic layer while heating the workpiece and the applied cleaning and annealing fluid takes place.

22. A method according to claim 21 where initially the cleaning and annealing fluid is de-ionized water, and thereafter the cleaning and annealing fluid is de-ionized deoxygenated water.

23. A method according to claim 22 wherein another cleaning and annealing fluid is used between usage of the de-ionized water and the de-ionized deoxygenated water.

24. A method according to claim 23 wherein the another cleaning and annealing fluid is an acid solution.

25. A method according to claim 23 wherein the another cleaning and annealing fluid is a dilute mineral acid solution.

26. A method according to claim 21 where a final cleaning and annealing fluid does not oxidize the metallic layer.

27. A method according to claim 26 wherein another cleaning and annealing fluid used prior to the final cleaning and annealing fluid includes an acid therein.

28. A method for cleaning and annealing a plated workpiece, the method comprising the steps of:
rinsing the workpiece using mineral acid;
rinsing the workpiece using de-ionized water; and
simultaneously cleaning and annealing the workpiece using heated deoxygenated de-ionized water.

29. A method according to claim 28, wherein the step of rinsing the workpiece using mineral acid is performed after the step of rinsing the workpiece using de-ionized water.

30. A method according to claim 28, wherein the step of simultaneously cleaning and annealing the workpiece is performed after the rinsing steps.

31. A method according to claim 28, wherein the steps of rinsing the workpiece using mineral acid and de-ionized water are performed while rotating the workpiece.

32. A method according to claim 28, wherein the mineral acid comprises a solution containing 1 to 15% sulfuric acid.

33. A method according to claim 28, wherein the heated deoxygenated de-ionized water comprises less than 0.1% sulfuric or sulfonic acids.

34. A method according to claim 28 further comprising the step of heating the deoxygenated de-ionized water and the workpiece while simultaneously cleaning and annealing the workpiece, wherein the deoxygenated de-ionized water is heated to a temperature between 60–99° C.

35. A method according to claim 28, wherein the workpiece comprises one of a semiconductor wafer, flat panel, magnetic film head, and a packaging substrate.

36. A method according to claim 28 further comprising the step of heating the workpiece to a temperature between 60 to 450° C.

37. A method according to claim 36, wherein the workpiece is heated for 5 seconds to 20 minutes.

38. A method according to claim 28 further comprising the step of deoxygenating the de-ionized water by adding bubbled nitrogen to the de-ionized water.

39. A method according to claim 28 further comprising the step of deoxygenating the de-ionized water by adding bubbled argon to the de-ionized water.

40. A method according to claim 28 further comprising the step of deoxygenating the de-ionized water by adding bubbled inert gas to the de-ionized water.

41. A method according to claim 28 further comprising the step of deoxygenating the de-ionized water by adding a reducing gas.

42. A method according to claim 28 further comprising the step of deoxygenating the de-ionized water by adding pentose sugar to the de-ionized water.

43. A method according to claim 28 further comprising the step of deoxygenating the de-ionized water by adding additives to the de-ionized water.

44. A method according to claim 28 wherein heated deoxygenated de-ionized water is heated to a temperature between 60 to 99° C. prior to cleaning and annealing the workpiece.

45. A method for altering the grain size and the texture of a metallic layer formed over an insulating substrate, the method comprising the step of heating the substrate and deoxygenated de-ionized water while applying the deoxygenated de-ionized water to the substrate.

46. A method according to claim 45, wherein the metallic layer comprises a plated layer.

47. A method according to claim 45, wherein the metallic layer comprises a seed-layer.

48. A method according to claim 45, wherein the deoxygenated de-ionized water is heated to a temperature between 60–99° C. prior to applying the deoxygenated de-ionized water to the substrate.

49. A method according to claim 45, further including the subsequent step of applying another metallic layer, and wherein grains in the metallic layer originally had a grain size of less than 100 nm and grains in the another metallic layer have a grain size of up to 2000 nm.

50. A method according to claim 45, wherein the texture is altered from a <111> orientation to either a <110> or a random orientation.

51. A method for altering the metallurgical properties of a first metallic layer on a workpiece before a second metallic layer is formed thereon, the method comprising the steps of:
forming the first metallic layer on an insulating substrate;
heating the workpiece and a cleaning and annealing fluid;
simultaneously cleaning and annealing the first metallic layer while the workpiece and the cleaning and annealing fluid remain heated; and
forming the second metallic layer on the first metallic layer after the cleaning and annealing fluid has been applied to the first metallic layer.

52. A method according to claim 51, wherein the first metallic layer and the second metallic layer are comprised of same material.

53. A method according to claim 51, wherein the first metallic layer and the second metallic layer are comprised of different material.

54. A method according to claim 51, wherein the cleaning and annealing fluid is heated to a temperature between 60–200° C. prior to applying the cleaning and annealing fluid to the workpiece.

55. A method according to claim 51, wherein the step of simultaneously cleaning and annealing alters one of a grain size, texture, and corrosion resistance property.

56. A method according to claim 55, further including the subsequent step of applying another metallic layer, and wherein grains in the metallic layer originally had a grain size of less than 100 nm and grains in the another metallic layer have a grain size of up to 2000 nm.

57. A method according to claim 56, wherein the corrosion resistance is improved by decreasing grain boundaries when the grain size is increased.

58. A method according to claim 55, wherein the texture is altered from a <111> orientation to either a <110> or a random orientation.

59. A method according to claim 51, wherein the first layer is a seed layer formed using CVD or electrodeless deposition.

60. A method for simultaneously cleaning and annealing a metallic layer plated on a workpiece having an insulating substrate, the method comprising the step of applying a heated cleaning and annealing fluid to the metallic layer to both clean and anneal the metallic layer.

61. A method according to claim 60, wherein the cleaning and annealing fluid comprises deoxygenated de-ionized water.

62. A method according to claim 60 further comprising the step of rotating the workpiece about a first axis while applying the heated cleaning and annealing fluid.

63. A method according to claim 60, wherein the metallic layer is annealed at a temperature between 60 to 450° C.

64. A method according to claim 63, wherein the metallic layer is heated for 5 seconds to 20 minutes.

65. A method according to claim 60, further including the step of heating the applied heated cleaning and annealing fluid to a temperature above the temperature at which the heated cleaning and annealing fluid was originally applied.

66. A method according to claim 65, wherein the heated cleaning and annealing fluid is heated to a temperature between 60–200° C.

67. A method according to claim 60 wherein the heated cleaning and annealing fluid changes during the time that the step of applying the heated cleaning and annealing fluid to the metallic layer takes place.

68. A method according to claim 67 where initially the heated cleaning and annealing fluid is de-ionized water, and thereafter the heated cleaning and annealing fluid is de-ionized deoxygenated water.

69. A method according to claim 68 wherein another heated cleaning and annealing fluid is used between usage of the de-ionized water and the de-ionized deoxygenated water.

70. A method according to claim 69 wherein the another heated cleaning and annealing fluid is an acid solution.

71. A method according to claim 69 wherein the another heated cleaning and annealing fluid is a dilute mineral acid solution.

72. A method according to claim 67 where a final heated cleaning and annealing fluid does not oxidize the metallic layer.

73. A method according to claim 72 wherein another heated cleaning and annealing fluid used prior to the final heated cleaning and annealing fluid includes an acid therein.

* * * * *